(12) United States Patent
Dong et al.

(10) Patent No.: US 11,799,306 B2
(45) Date of Patent: Oct. 24, 2023

(54) BATTERY INTERNAL RESISTANCE DETECTION DEVICE AND METHOD

(71) Applicant: Delta Electronics (Shanghai) Co., Ltd., Shanghai (CN)

(72) Inventors: Mingxuan Dong, Shanghai (CN); Changyong Wang, Shanghai (CN); Aibin Qiu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 90 days.

(21) Appl. No.: 17/238,214

(22) Filed: Apr. 23, 2021

(65) Prior Publication Data
US 2021/0376637 A1 Dec. 2, 2021

(30) Foreign Application Priority Data
May 27, 2020 (CN) .......................... 202010459504.5

(51) Int. Cl.
*H02J 7/00* (2006.01)
*G01R 31/389* (2019.01)

(52) U.S. Cl.
CPC .......... *H02J 7/0047* (2013.01); *G01R 31/389* (2019.01); *H02J 7/007* (2013.01); *H02J 7/0029* (2013.01); *H02J 2207/20* (2020.01)

(58) Field of Classification Search
CPC .................................................... G01R 27/08
See application file for complete search history.

(56) References Cited

U.S. PATENT DOCUMENTS 8,489,264 B2 7/2013 Morita et al.
11,385,293 B2 * 7/2022 Fujita ................ H02J 7/007186
(Continued)

FOREIGN PATENT DOCUMENTS

CN 101477179 A 7/2009
CN 101477149 B 12/2011
(Continued)

OTHER PUBLICATIONS

CN-103760492 translation, Cheng (Year: 2014).*
WO-2019054020 translation (Year: 2019).*

*Primary Examiner* — Drew A Dunn
*Assistant Examiner* — Tynese V McDaniel
(74) *Attorney, Agent, or Firm* — CKC & Partners Co., LLC

(57) ABSTRACT

The application relates to battery internal resistance detection device and method for power conversion device. The detection device includes a data acquisition module for acquiring a battery voltage and a battery current to obtain a DC voltage, an AC voltage, a DC current and an AC current, a first calculation module for receiving the AC current and the AC voltage at a certain instant to output a first internal resistance value and a battery capacitance, a second calculation module for receiving a plurality of DC currents and a plurality of DC voltages at multiple instants and the battery capacitance to output a second internal resistance value, and a selection module for receiving the first and second internal resistance value and selecting one of the first and second internal resistance value as battery internal resistance value. The application improves detection accuracy of battery internal resistance by combining DC and AC algorithms.

11 Claims, 3 Drawing Sheets

(56) References Cited

U.S. PATENT DOCUMENTS

| | | | |
|---|---|---|---|
| 2001/0033169 A1* | 10/2001 | Singh | G01R 31/389 324/426 |
| 2003/0020478 A1* | 1/2003 | Scott | G01R 31/396 324/426 |
| 2004/0220752 A1* | 11/2004 | Gopal | G01R 31/389 702/31 |
| 2009/0051364 A1* | 2/2009 | Ishida | H02J 7/0048 324/430 |
| 2010/0250038 A1* | 9/2010 | Morita | B60L 58/12 320/136 |
| 2011/0301931 A1* | 12/2011 | Gering | G01R 31/392 703/13 |
| 2012/0007556 A1* | 1/2012 | Matsui | B60L 3/04 320/112 |
| 2014/0285156 A1* | 9/2014 | Mukaitani | G01R 31/3842 320/134 |
| 2015/0241521 A1* | 8/2015 | Wu | G01R 31/385 702/63 |
| 2015/0301118 A1* | 10/2015 | Tao | H01M 10/4285 702/63 |
| 2016/0028095 A1* | 1/2016 | Sakai | H01M 8/04649 429/430 |
| 2016/0223617 A1* | 8/2016 | Tao | G01R 31/392 |
| 2016/0336792 A1* | 11/2016 | Terazono | H02J 3/32 |
| 2017/0160349 A1* | 6/2017 | Iida | H02J 7/005 |
| 2019/0036373 A1* | 1/2019 | Shimura | H01M 10/0431 |
| 2019/0049518 A1* | 2/2019 | Shen | H01M 10/48 |
| 2019/0137569 A1* | 5/2019 | Swan | H01M 10/48 |
| 2022/0123372 A1* | 4/2022 | Hara | H01M 10/44 |
| 2022/0140622 A1* | 5/2022 | Fornage | H02J 7/0014 320/118 |

FOREIGN PATENT DOCUMENTS

| | | | | |
|---|---|---|---|---|
| CN | 103760492 | A | * | 4/2014 |
| CN | 103760492 | A | | 4/2014 |
| CN | 106324510 | A | | 1/2017 |
| CN | 205920161 | U | | 2/2017 |
| CN | 107290683 | A | | 10/2017 |
| JP | 2018146441 | A | | 9/2018 |
| JP | 2019160775 | A | | 9/2019 |
| KR | 20190125906 | A | | 11/2019 |
| TW | 472426 | B | | 1/2002 |
| TW | M485518 | U | | 9/2014 |
| TW | I601358 | B | | 10/2017 |
| TW | I632379 | B | | 8/2018 |
| WO | 2019054020 | A1 | | 3/2019 |
| WO | WO-2019054020 | A1 | * | 3/2019 ............. B60L 58/12 |

\* cited by examiner

BATTERY INTERNAL RESISTANCE DETECTION DEVICE AND METHOD

CROSS-REFERENCE TO RELATED APPLICATIONS

This non-provisional application claims priority under 35 U.S.C. § 119(a) on Patent Application No. 202010459504.5 filed in P.R. China on May 27, 2020, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The application relates to a detection device and method, and particularly to a battery internal resistance detection device and method.

BACKGROUND

Currently, batteries are widely applied to various electronic devices, and if the batteries fail or have insufficient capacity, serious accidents may occur, so operating parameters of the batteries should be comprehensively monitored online. Internal resistance of the battery is an important technical indictor for measuring performance of the battery. Increasement of the battery internal resistance will reduce discharge working voltage of the battery, shorten discharge time, and bring serious influence to the performance and service life of the battery.

Accordingly, if the internal resistance of the battery is too large, the battery will be damaged, so it requires to monitor the battery internal resistance and predict tendency of variation of the internal resistance. The prior art detects the battery internal resistance using a DC algorithm or an AC algorithm. However, the DC algorithm and the AC algorithm both should be utilized under corresponding applicable conditions, and if the detection is performed under a non-applicable condition, the detected battery internal resistance is not accurate. Moreover, as for the DC algorithm, in the process of detecting the battery internal resistance using the battery current, an open-circuit voltage of the battery varies, thereby influencing detection accuracy of the DC algorithm.

Therefore, currently, it is desired for a battery internal resistance detection device and method capable of improving the above known techniques.

SUMMARY

To improve detection accuracy of the battery internal resistance, the application provides a battery internal resistance detection device and method.

According to the first aspect of the application, a battery internal resistance detection device for a power conversion device is provided. The power conversion device includes a battery and a power converter coupled to the battery. The battery internal resistance detection device includes a data acquisition module, a first calculation module, a second calculation module and a selection module. The data acquisition module acquires a battery voltage and a battery current to obtain a DC voltage and an AC voltage of the battery voltage, and a DC current and an AC current of the battery current. The first calculation module receives the AC current and the AC voltage acquired by the data acquisition module at a certain time point to output a first internal resistance value and a battery capacitance. The second calculation module receives a plurality of DC currents and a plurality of DC voltages acquired by the data acquisition module at multiple time points and the battery capacitance to output a second internal resistance value. The selection module receives the first internal resistance value and the second internal resistance value, and selects one of the first internal resistance value and the second internal resistance value as a battery internal resistance.

In some embodiments, the battery internal resistance detection device further includes a protection module. The protection module receives the battery internal resistance value and outputs a switching signal to the power converter when the battery internal resistance value is greater than a reference resistance value.

In some embodiments, the protection module further includes a regulator, a current controller, and a modulator. The regulator regulates a battery current reference value according to the battery internal resistance value. The current controller regulates the battery current according to the regulated battery current reference value to acquire a control signal. The modulator acquires the switching signal according to the control signal.

In some embodiments, the selection module selects the first internal resistance value as the battery internal resistance value when the DC current is less than a current threshold. The selection module selects the second internal resistance value as the battery internal resistance when the DC current is greater than the current threshold.

In some embodiments, the first calculation module calculates a peak voltage, a peak current and a phase difference according to the AC current and the AC voltage, and acquires the first internal resistance value and the battery capacitance according to the peak voltage, the peak current and the phase difference.

In some embodiments, the second calculation module calculates an open-circuit voltage variation of the battery within a time period according to the battery capacitance and the plurality of DC currents, and acquires the second internal resistance value according to the plurality of DC voltages, the open-circuit voltage variation and the plurality of DC currents.

In some embodiments, the data acquisition module includes a first filter, a second filter, a third filter and a fourth filter. The first filter receives the battery current, and outputs the AC current through filtering. The second filter receives the battery current, and outputs the DC current through filtering. The third filter receives the battery voltage, and outputs the AC voltage through filtering. The fourth filter receives the battery voltage, and outputs the DC voltage through filtering.

In some embodiments, the first filter and the third filter are band-pass filters, and the second filter and the fourth filter are low-pass filters.

According to the second aspect of the application, a battery internal resistance detection method is provided. The method includes: (a) acquiring a battery voltage and a battery current to obtain a DC voltage and an AC voltage of the battery voltage, and a DC current and an AC current of the battery current; (b) calculating a first internal resistance value and a battery capacitance according to the AC current and the AC voltage acquired at a certain time point; (c) calculating a second internal resistance value according to a plurality of DC currents and a plurality of DC voltages acquired at multiple time points and the battery capacitance; and (d) selecting one of the first internal resistance value and the second internal resistance value as a battery internal resistance value.

In some embodiments, the method further includes: (e) outputting a switching signal to the power converter to regulate the battery current when the battery internal resistance value is greater than a reference resistance value.

In some embodiments, in the step (e), regulate a battery current reference value according to the battery internal resistance value; regulate the battery current according to the regulated battery current reference value to acquire a control signal; and acquiring the switching signal according to the control signal.

In some embodiments, the step (d) includes: selecting the first internal resistance value as the battery internal resistance value when the DC current is less than a current threshold; selecting the second internal resistance value as the battery internal resistance value when the DC current is greater than the current threshold.

In some embodiments, the step (b) includes: calculating a peak voltage, a peak current and a phase difference according to the AC current and the AC voltage, and acquiring the first internal resistance value and the battery capacitance according to the peak voltage, the peak current and the phase difference.

In some embodiments, the step (c) includes: calculating an open-circuit voltage variation of the battery within a time period according to the battery capacitance, and acquiring the second internal resistance value according to the DC voltages, the open-circuit voltage variation and the DC currents.

In the battery internal resistance detection device and method of the application, the DC algorithm is corrected based on a result of the AC algorithm, and detection result of the DC algorithm or the AC algorithm is selected as a battery internal resistance value according to actual requirements, so as to improve detection accuracy of the battery internal resistance. When the internal resistance of the battery is too large, the battery internal resistance is reduced by regulating the battery current, thereby improving the service life of the battery. For example, a current having direction opposite to a direction of the battery current is inputted to reduce the battery internal resistance, thereby improving the service life of the battery.

DETAILED DESCRIPTION

Typical embodiments representing features and advantages of the application will be described in detail below. It should be understood that variations can be made in different aspects of the application without departing from the scope protected by the application, of which description and illustration are provided for explanation, and should not be considered limiting the application.

Figure 1:
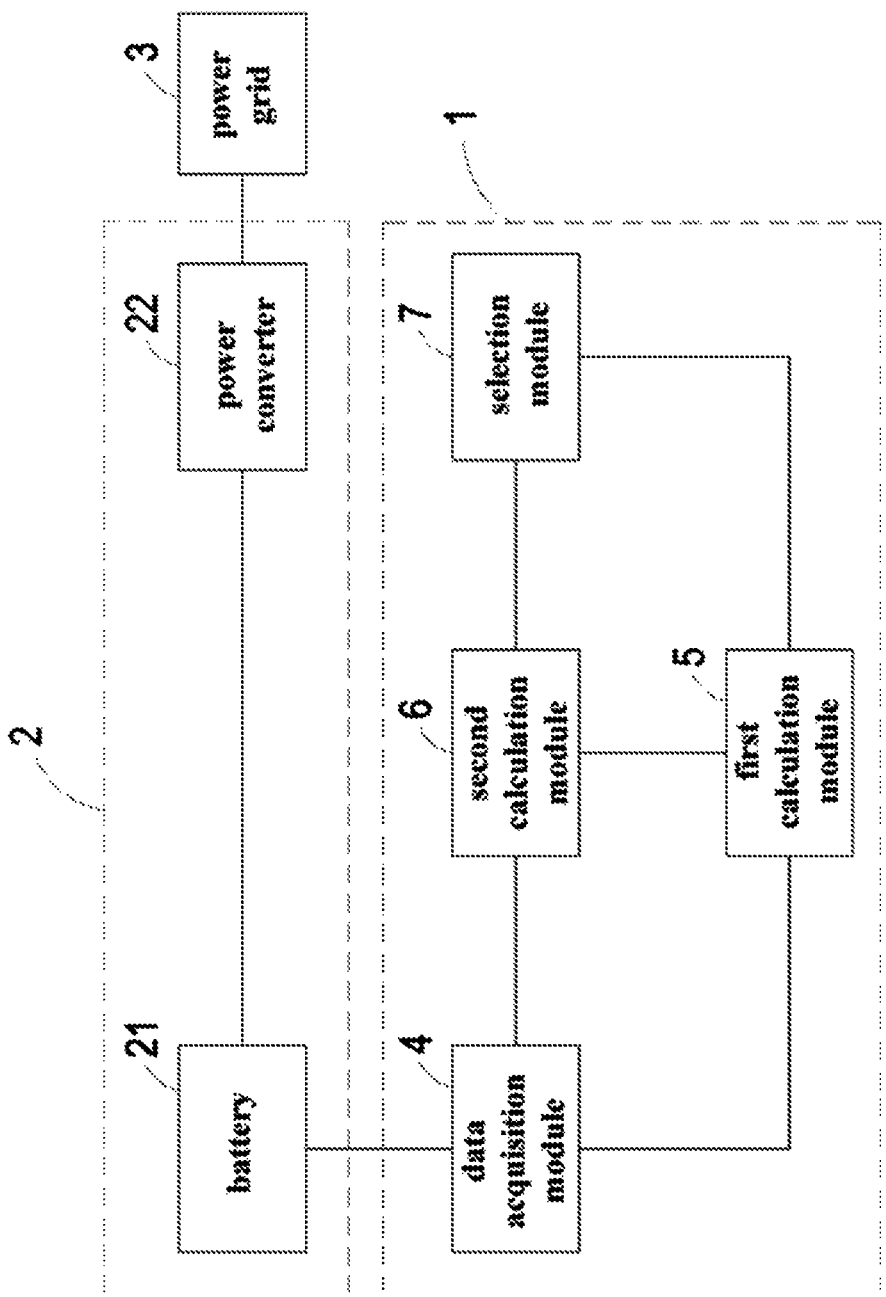
FIG. 1 is a schematic diagram illustrating a circuit structure of a battery internal resistance detection device according to an embodiment of the application.

FIG. 1 is a schematic diagram illustrating a circuit of a battery internal resistance detection device according to an embodiment of the application. As shown in FIG. 1, a power conversion device 2 includes a battery 21 and a power converter 22, and the power converter 22 is a DC/AC converter. The battery 21 is coupled to a DC side of the DC/AC converter, and an AC side of the DC/AC converter is coupled to a power grid 3. The battery internal resistance detection device 1 is coupled to the battery 21, and includes a data acquisition module 4, a first calculation module 5, a second calculation module 6 and a selection module 7. The data acquisition module 4 acquires a battery voltage and a battery current of the battery 21, and acquires a DC voltage and an AC voltage of the battery voltage, and a DC current and an AC current of the battery current.

In some embodiments, the AC voltage of the battery voltage and the AC current of the battery current can be acquired through a method below. A negative sequence component is inputted into the power conversion device 2 through the DC/AC converter, and thus a double-frequency current will be generated at the DC side of the DC/AC converter, and a double-frequency voltage fluctuation will be generated from the double-frequency DC side current. The DC side current is the battery current, and the DC side voltage is the battery voltage. Double-frequency fluctuations in the battery voltage and the battery current are extracted by filters, but the application is not limited thereto. For example, other frequency component (such as, triple frequency) can be inputted into the power conversion device through the DC/AC converter, as long as a fluctuation in the DC side voltage and current can occur and the fluctuation can be detected. Of course, the battery in the application also may be coupled to a DC/DC converter, or the power converter 22 is coupled to a load.

The first calculation module 5 receives the AC current and the AC voltage acquired by the data acquisition module 4 at a certain time point, and outputs a first internal resistance value $R_1$ and a battery capacitance $C_{bat}$ via calculation. It should be noted that the battery capacitance $C_{bat}$ is substantially a battery equivalent capacitance. The second calculation module 6 receives a plurality of DC currents $I_{dc1}$, $I_{dc2}$, ..., a plurality of DC voltages $U_{dc1}$, $U_{dc2}$, ... acquired by the data acquisition module 4 at multiple time points and the battery capacitance $C_{bat}$ outputted from the first calculation module 5, and outputs a second internal resistance value $R_2$ via calculation.

The first calculation module 5 detects a battery internal resistance based on an AC algorithm, and the second calculation module 6 detects the battery internal resistance based on a DC algorithm. The battery voltage $U_{dc}$ is constituted of an open-circuit voltage $U_0$ and a polarization voltage $\Delta U$, as shown in formula (1).

$$U_{dc} = U_0 + \Delta U \qquad (1)$$

The polarization voltage $\Delta U$ is a voltage drop generated due to the battery internal resistance value R and the charging and discharging currents $I_{dc}$, as shown in formula (2).

$$\Delta U = R * I_{dc} \qquad (2)$$

Therefore, formula (3) can be inferred from the formulas (1) and (2).

$$U_{dc}=U_0+\Delta U=U_0+R*I_{dc} \quad (3)$$

In the known DC algorithm, the DC currents $I_{dc1}$, $I_{dc2}$ and the battery voltages $U_{dc1}$, $U_{dc2}$ are acquired at different time points, and a change of the DC currents $I_{dc1}$, $I_{dc2}$ within a short time does not cause variation of capacity of the battery 21, so a State of Charge (SOC) of the battery 21 keeps constant, and thus the open-circuit voltage $U_0$ also keeps constant. The DC currents $I_{dc1}$, $I_{dc2}$ and the battery voltages $U_{dc1}$, $U_{dc2}$ acquired at different time points are put into the formula (3) to infer the formula (4). Then, formula (5) is inferred from the formula (4). In the formula (5), the battery internal resistance value R is calculated through two groups of the DC currents $I_{dc1}$, $I_{dc2}$ and the battery voltages $U_{dc1}$, $U_{dc2}$.

$$U_{dc1} = U_0 + R*I_{dc1} \quad (4)$$
$$U_{dc2} = U_0 + R*I_{dc2}$$

$$R = \frac{U_{dc2} - U_{dc1}}{I_{dc2} - I_{dc1}} \quad (5)$$

However, in the above known DC algorithm, large DC currents $I_{dc1}$, $I_{dc2}$ are necessary for improving detection accuracy of the battery internal resistance R. Moreover, since there is a high frequency ripple in the battery current, it needs additional low-pass filtering of the battery current through a filter to obtain the DC currents $I_{dc1}$, $I_{dc2}$, and a time delay caused by the filtering leads to variation of the open-circuit voltage $U_0$, instead of a fixed value, thereby influencing detection accuracy of the battery internal resistance value R. Therefore, the battery internal resistance value R detected by the known DC algorithm from the formulas (1)-(5) is not accurate.

In this embodiment, when the battery current is small, the battery internal resistance is detected using the AC algorithm, when the battery current is large, the battery internal resistance is detected using the DC algorithm. A deviation of the open-circuit voltage of the battery 21 in the DC algorithm is corrected by the acquired battery capacitance $C_{bat}$, thereby increasing accuracy of the battery internal resistance detected by the DC algorithm.

The selection module 7 receives the first internal resistance value $R_1$ outputted from the first calculation module 5 and the second internal resistance value $R_2$ outputted from the second calculation module 6, and selects one of the first internal resistance value $R_1$ and the second internal resistance value $R_2$ as the battery internal resistance value.

Since detection accuracy and applicable conditions of the AC algorithm and the DC algorithm are different, users may timely regulate judging criterion of the selection module to select a relatively accurate battery internal resistance value according to actual situations, thereby improving accuracy of the acquired battery internal resistance value. For example, in some embodiments, when the DC current is less than a current threshold, the selection module 7 selects the first internal resistance value $R_1$ calculated by the AC algorithm as the battery internal resistance value, and when the DC current is greater than the current threshold, the selection module 7 selects the second internal resistance value $R_2$ calculated by the DC algorithm as the battery internal resistance value. Detection accuracy of the battery internal resistance is improved by combining the DC algorithm and the AC algorithm.

In some other embodiments, when the battery current is less than the current threshold, the selection module 7 selects the first internal resistance value $R_1$ calculated by the AC algorithm as the battery internal resistance value, and when the battery current is greater than the current threshold, the selection module 7 selects the second internal resistance value $R_2$ calculated by the DC algorithm as the battery internal resistance value.

Figure 2:
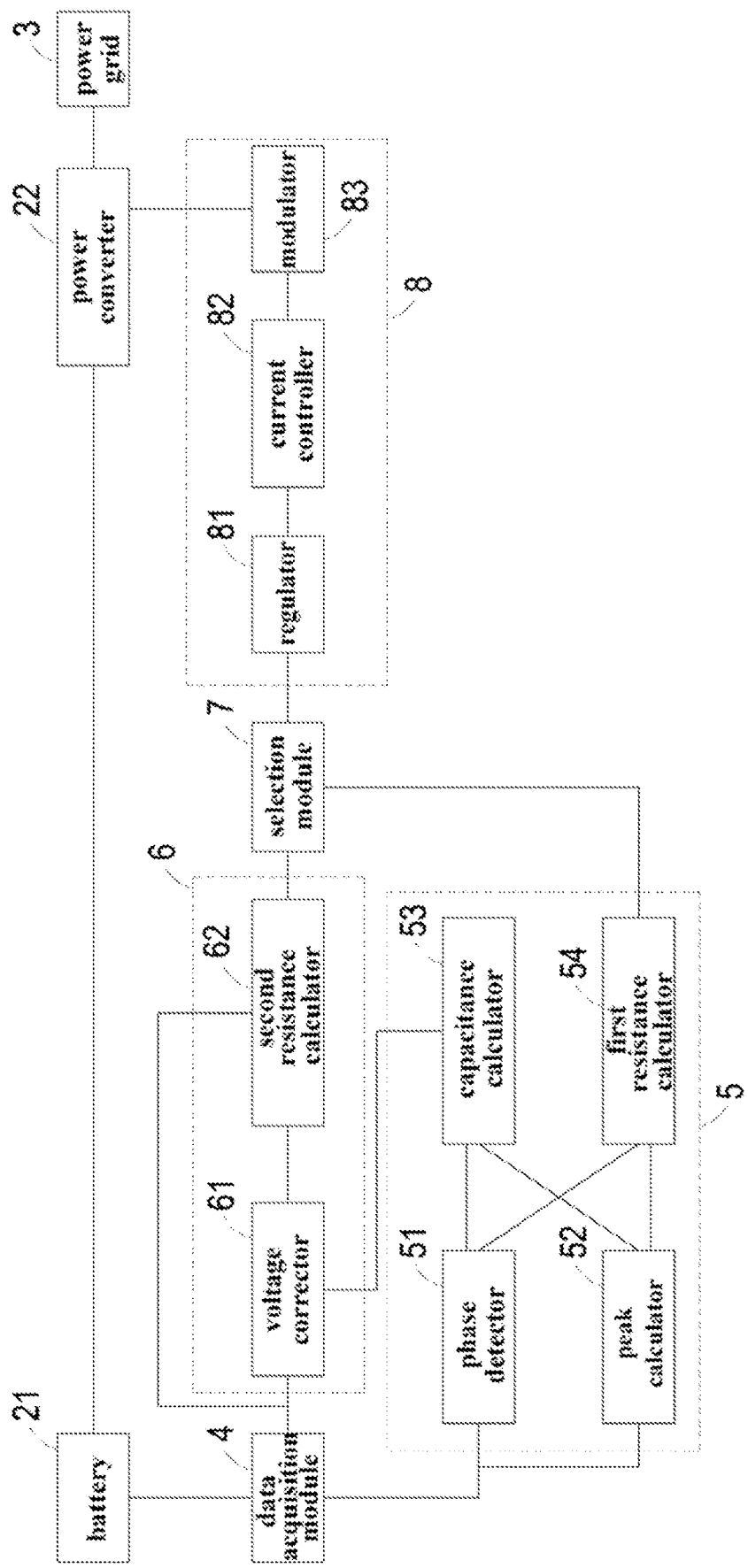
FIG. 2 is a schematic diagram illustrating a circuit structure of a battery internal resistance detection device according to another embodiment of the application.

Please refer to FIG. 2, which is a schematic diagram illustrating a circuit structure of a battery internal resistance detection device according to another embodiment of the application. The battery internal resistance detection device 1 further includes a protection module 8 for receiving the battery internal resistance value outputted from the selection module 7. When the battery internal resistance value is too large (for example, the battery internal resistance value is greater than a reference resistance value), the protection module 8 outputs a switching signal to the power converter 22, and the power converter 22 regulates the battery current of the battery 21 according to the switching signal. The battery internal resistance is reduced by regulating the battery current, thereby improving the service life of the battery. In some embodiments, reducing the battery internal resistance is not limited to regulating the battery current, and the power converter 22 also can reduce the battery internal resistance by inputting a current having a direction opposite to a direction of the battery current, thereby improving the service life of the battery.

As shown in FIG. 2, the first calculation module 5 includes a phase detector 51 and a peak calculator 52. By inputting a negative sequence component into the power conversion device 2 through the power converter 22, a double-frequency current is generated at the DC side of the power converter 22, and a double-frequency voltage fluctuation is generated from the double-frequency current. The DC side current is the battery current, and the DC side voltage is the battery voltage. The data acquisition module 4 includes second-order band-pass filters through which a double-frequency fluctuation in the battery voltage is extracted as an AC voltage, and a double-frequency fluctuation in the battery current is extracted as an AC current. The phase detector 51 receives the AC current and the AC voltage acquired by the data acquisition module 4, and acquires a phase difference θ between the AC current and the AC voltage via calculation. The peak calculator 52 receives the AC current and the AC voltage acquired by the data acquisition module 4, and acquires a peak current $I_{rms}$ and a peak voltage $V_{rms}$ via calculation. The first calculation module 5 further includes a first resistance calculator 54 and a capacitance calculator 53, which calculate the first internal resistance value $R_1$ and the battery capacitance $C_{bat}$ respectively according to the phase difference θ, the peak current $I_{rms}$ and the peak voltage $V_{rms}$, as shown in formulas (6) and (7).

$$R_1 = \frac{V_{rms}}{I_{rms}}\cos\theta \quad (6)$$

$$C_{bat} = \frac{V_{rms}}{I_{rms}}\sin\theta \quad (7)$$

As shown in FIG. 2, the second calculation module 6 includes a voltage corrector 61 and a second resistance calculator 62. The battery 21 can be considered as a capacitor with a large capacitance, so voltage variation of the battery 21 during charging can be calculated depending on capacitance characteristics. The voltage corrector 61 receives the DC currents $I_{dc}$ acquired by the data acquisition module 4 and the battery capacitance $C_{bat}$ outputted from the first calculation module 5, and outputs an open-circuit voltage variation $U_{02}-U_{01}$ of the battery within a period of time via calculation, as shown in formula (8).

$$(U_{02} - U_{01}) = \frac{1}{C_{bat}} \int_{t_1}^{t_2} I_{dc} dt \qquad (8)$$

Wherein, $U_{01}$ is the open-circuit voltage at time $t_1$, and $U_{02}$ is the open-circuit voltage at time $t_2$.

The second resistance calculator 62 receives the DC voltages $U_{dc1}$, $U_{dc2}$ and the DC currents $I_{dc1}$, $I_{dc2}$ acquired by the data acquisition module 4 and the open-circuit voltage variation $U_{02}-U_{01}$ of the battery 21 outputted from the voltage corrector 61, and outputs the second internal resistance value $R_2$ via calculation, as shown in formulas (9) and (10). The formula (9) is a relationship between the DC voltages $U_{dc1}$, $U_{dc2}$, the DC currents $I_{dc1}$, $I_{dc2}$ and the open-circuit voltages $U_{02}$, $U_{01}$, the formula (10) can be inferred from the formula (9), and the second internal resistance value $R_2$ is calculated via the formula (10).

$$U_{dc1} = U_{01} + R_2 * I_{dc1} \qquad (9)$$
$$U_{dc2} = U_{02} + R_2 * I_{dc2}$$

$$R_2 = \frac{U_{dc2} - U_{dc1} - (U_{02} - U_{01})}{I_{dc2} - I_{dc1}} = \frac{U_{dc2} - U_{dc1} - \left(\frac{1}{C_{bat}} \int_{t_1}^{t_2} I_{dc} dt\right)}{I_{dc2} - I_{dc1}} \qquad (10)$$

The second calculation module 6 corrects a derivation of the open-circuit voltage of the battery 21 within a corresponding time period using the battery capacitance $C_{bat}$ outputted from the first calculation module 5, thereby increasing accuracy of the battery internal resistance detected by the DC algorithm.

The protection module 8 comprises a regulator 81, a current controller 82 and a modulator 83. The regulator 81 receives the battery internal resistance value and regulates a battery current reference value according to the battery internal resistance value. Specifically, when the battery internal resistance value is greater than a protection threshold, a correcting current is generated according to a difference between the actual internal resistance value and the protection threshold. The correcting current is superposed with the battery current reference value to obtain the regulated battery current reference value. The current controller 82 regulates an actual battery current according to the regulated battery current reference value. Specifically, a deviation signal is obtained according to the regulated battery current reference value and the actual battery current, and a control signal is obtained from a closed-loop control of the deviation signal. The modulator 83 receives the control signal, and outputs the switching signal. For example, the modulator 83 modulates the control signal to obtain the switching signal, and controls switch operation of the power converter. The modulator 83 may be, for example, but not limited to Pulse-Width Modulation. In the embodiment, the switching signal can be obtain only according to the control signal. However, in other embodiments, the control signal is superposed with control signals from other control loops to obtain a total control signal. The switching signal can be obtain according to the total control signal and control switch operation of the power converter to realize multiple functions.

In some embodiments, the data acquisition module 4 includes a first filter, a second filter, a third filter and a fourth filter. The first filter receives the battery current, and outputs the AC current through filtering. The second filter receives the battery current, and outputs the DC current through filtering. The third filter receives the battery voltage, and outputs the AC voltage through filtering. The fourth filter receives the battery voltage, and outputs the DC voltage through filtering. The first filter and the third filter may be, for example, but not limited to band-pass filters or second-order band-pass filters, and the second filter and the fourth filter may be, for example, but not limited to low-pass filters.

Figure 3:
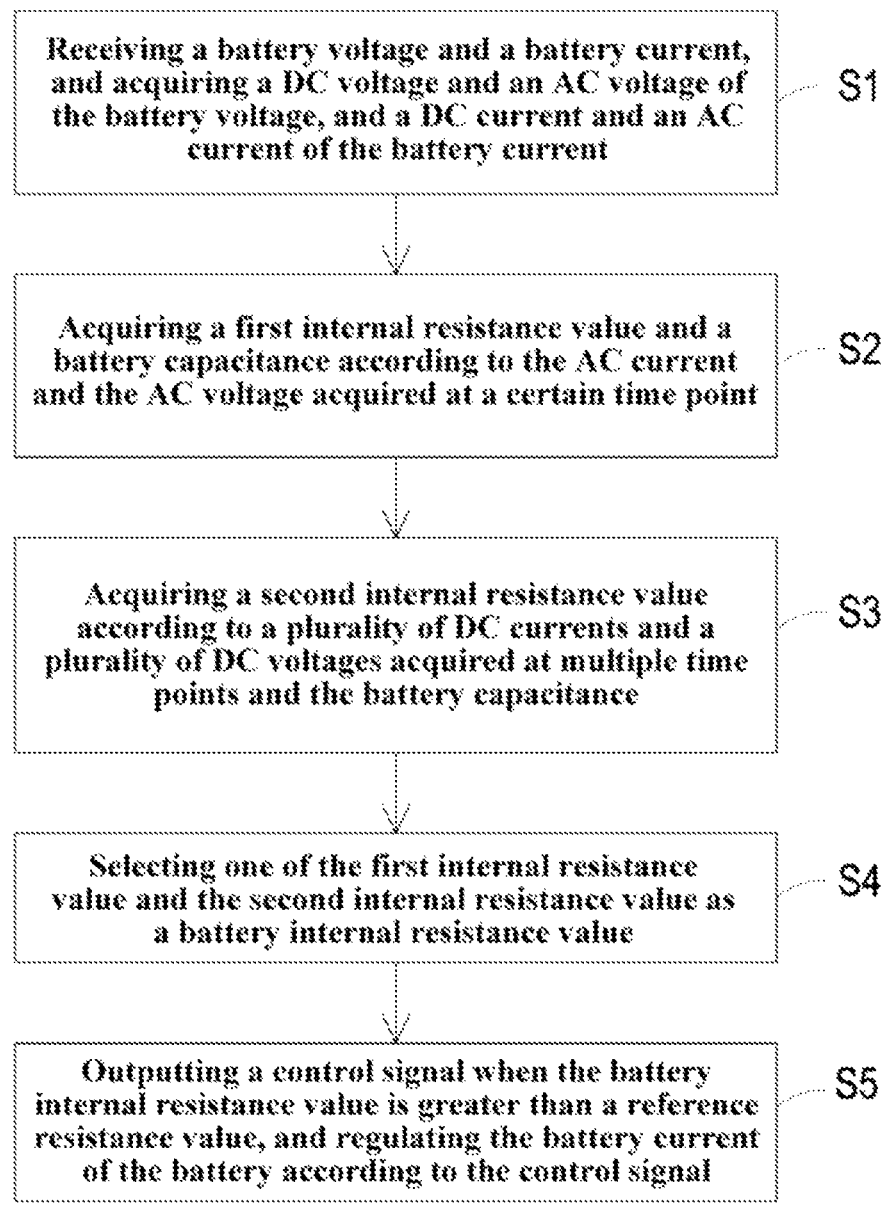
FIG. 3 is a flow chart illustrating a battery internal resistance detection method according to an embodiment of the application.

FIG. 3 is a flow chart illustrating a battery internal resistance detection method according to a embodiment of the application. As shown in FIG. 3, the battery internal resistance detection method includes:

Step S1, receiving a battery voltage and a battery current, and acquiring a DC voltage and an AC voltage of the battery voltage, and a DC current and an AC current of the battery current;

Step S2, acquiring a first internal resistance value and a battery capacitance according to the AC current and the AC voltage acquired at a certain time point;

Step S3, acquiring a second internal resistance value according to a plurality of DC currents and a plurality of DC voltages acquired at multiple time points and the battery capacitance; and Step S4, selecting one of the first internal resistance value and the second internal resistance value as a battery internal resistance value.

In some embodiments, in the step (4), when the battery current is less than a current threshold, the first internal resistance value is selected as the battery internal resistance value, and when the battery current is greater than the current threshold, the second internal resistance value is selected as the battery internal resistance value. Detection accuracy of the battery internal resistance is improved by combining a DC algorithm and an AC algorithm.

In some embodiments, the battery internal resistance detection method further includes a step S5. In the step S5, when the battery internal resistance value is greater than a reference resistance value, a battery current reference value is regulated according to the battery internal resistance value; a deviation signal is acquired according to the regulated battery current reference value and the battery current, and a control signal is acquired by controlling the deviation signal; and the switching signal is acquired according to the control signal. Specifically, when the battery internal resistance value is greater than a protection threshold, a correcting current is generated according to a difference between the detected internal resistance value and the protection threshold, the correcting current is superposed with the battery current reference value to obtain the regulated battery current reference value. The regulated battery current reference value is a reference value of the charging and discharging currents, and the actual battery current is the actual charging and discharging currents. The actual battery current is regulated according to the regulated battery current reference value. The deviation signal is obtained according to the regulated battery current reference value and the actual battery current, and the control signal is obtained from closed-loop control of the deviation signal. The switching signal is obtained by modulating the control signal and inputted into the power converter 22 to control switch operation of the power converter, thereby regulating the battery current to follow the regulated reference value.

In some embodiments, in the step S2, a peak voltage, a peak current and a phase difference are calculated according to the AC current and the AC voltage, and the first internal resistance value and the battery capacitance are calculated according to the peak voltage, the peak current and the phase difference (as shown in formulas (6) and (7)).

In some embodiments, in the step S3, an open-circuit voltage variation of the battery 21 within a time period from $t_1$ to $t_2$ is calculated according to the battery capacitance and the DC currents, and the second internal resistance value is calculated according to the DC voltages, the open-circuit voltage variation and the DC currents. The DC voltages correspond to DC voltages at time $t_1$ and $t_2$, and the DC currents correspond to DC currents at time $t_1$ and $t_2$ (as shown in formulas (8), (9) and (10)).

In some embodiments, in the step S1, the battery current is filtered to obtain the AC current and the DC current, and the battery voltage is filtered to obtain the AC voltage and the DC voltage. For example, the battery current and the battery voltage are low-pass filtered respectively to obtain the DC current and the DC voltage, and the battery current and the battery voltage are band-pass filtered respectively to obtain the AC current and the AC voltage.

In conclusion, the application provides a battery internal resistance detection device and method, which correct the DC algorithm based on a result of the AC algorithm, and select the battery internal resistance value detected by the DC algorithm or the AC algorithm according to actual requirements, thereby improving detection accuracy of the battery internal resistance. If the detected battery internal resistance is too large, the battery internal resistance is reduced by regulating the battery current, or inputting a current having a direction opposite to a direction of the battery current, thereby improving service life of the battery.

It should be noted that the foregoing descriptions are only to explain the preferable embodiments proposed in the application, but the application is not limited thereto, and the scope protected by the application is determined by the appended claims. Moreover, those skilled in the art can make further modifications to the embodiments of the application, and these modifications all fall into the scope protected by the appended claims.

What is claimed is:

1. A battery internal resistance detection device for detecting internal resistance of a batter used in a power conversion device, the power conversion device including the battery and a power converter coupled to the battery, wherein the battery internal resistance detection device comprises:
   a data acquisition circuit configured to acquire a battery voltage and a battery current to obtain a DC voltage and an AC voltage of the battery voltage, and a DC current and an AC current of the battery current;
   a first calculation circuit configured to receive the AC current and the AC voltage acquired by the data acquisition circuit at a certain time point, and to calculate a first internal resistance value and a battery capacitance according to the AC voltage, the AC current, and a phase difference between the AC voltage and the AC current, and to output the first internal resistance value and the battery capacitance;
   a second calculation circuit configured to receive a plurality of DC currents and a plurality of DC voltages acquired by the data acquisition circuit at multiple time points and the battery capacitance, and to calculate a second internal resistance value according to the plurality of DC currents, the plurality of DC voltages and the battery capacitance, and to output the second internal resistance;
   a selection circuit configured to receive the first internal resistance value and the second internal resistance value, and to select one of the first internal resistance value and the second internal resistance value as a battery internal resistance value; and
   a protection circuit configured to receive the battery internal resistance value, and to output a switching signal to the power converter when the battery internal resistance value is greater than a reference resistance value, the protection circuit comprising:
      a regulator configured to regulate a battery current reference value according to the battery internal resistance value;
      a current controller configured to regulate the battery current according to the regulated battery current reference value to acquire a control signal; and
      a modulator configured to regulate the switching signal according to the control signal.

2. The battery internal resistance detection device according to claim 1, wherein
   the selection circuit selects the first internal resistance value as the battery internal resistance value when the DC current is less than a current threshold; and
   the selection circuit selects the second internal resistance value as the battery internal resistance value when the DC current is greater than the current threshold.

3. The battery internal resistance detection device according to claim 1, wherein the first calculation circuit calculates a peak voltage, a peak current and a phase difference according to the AC current and the AC voltage, and calculates the first internal resistance value and the battery capacitance according to the peak voltage, the peak current and the phase difference.

4. The battery internal resistance detection device according to claim 1, wherein the second calculation circuit calculates an open-circuit voltage variation of the battery within a time period according to the battery capacitance and the plurality of DC currents, and acquires calculates the second internal resistance value according to the plurality of DC voltages, the open-circuit voltage variation and the plurality of DC currents.

5. The battery internal resistance detection device according to claim 1, wherein the data acquisition circuit comprises:
   a first filter configured to receive the battery current, and outputting to output the AC current through filtering;
   a second filter configured to receive the battery current, and to output the DC current through filtering;
   a third filter configured to receive the battery voltage, and to output the AC voltage through filtering; and
   a fourth filter configured to receive the battery voltage, and to output the DC voltage through filtering.

6. The battery internal resistance detection device according to claim 5, wherein the first filter and the third filter are band-pass filters, and the second filter and the fourth filter are low-pass filters.

7. A battery internal resistance detection method for detecting internal resistance of a battery used in a power conversion device, the power conversion device including the battery and a power converter coupled to the battery, wherein the method comprises:

(a) acquiring a battery voltage and a battery current to obtain a DC voltage and an AC voltage of the battery voltage, and a DC current and an AC current of the battery current;
(b) calculating a first internal resistance value and a battery capacitance according to the AC current and the AC voltage acquired at a certain time point and a phase difference between the AC voltage and the AC current;
(c) calculating a second internal resistance value according to a plurality of DC currents and a plurality of DC voltages acquired at multiple time points and the battery capacitance;
(d) selecting one of the first internal resistance value and the second internal resistance value as a battery internal resistance value, and
(e) outputting a switching signal to the power converter when the battery internal resistance value is greater than a reference resistance value, wherein the power converter regulates the battery current in response to the switching signal.

8. The battery internal resistance detection method according to claim 7, wherein, in the step (e), regulating a battery current reference value according to the battery internal resistance value; regulating the battery current according to the regulated battery current reference value to acquire a control signal; and acquiring the switching signal according to the control signal.

9. The battery internal resistance detection method according to claim 7, wherein the step (d) comprises:
selecting the first internal resistance value as the battery internal resistance when the DC current is less than a current threshold; and
selecting the second internal resistance as the battery internal resistance value when the DC current is greater than the current threshold.

10. The battery internal resistance detection method according to claim 7, wherein the step (b) comprises:
calculating a peak voltage, a peak current and a phase difference according to the AC current and the AC voltage, and calculating the first internal resistance value and the battery capacitance according to the peak voltage, the peak current and the phase difference.

11. The battery internal resistance detection method according to claim 7, wherein the step (c) comprises:
calculating an open-circuit voltage variation of the battery within a time period according to the battery capacitance, and acquiring the second internal resistance value according to the DC voltages, the open-circuit voltage variation and the DC currents.

* * * * *